(12) United States Patent
Payne et al.

(10) Patent No.: US 6,233,811 B1
(45) Date of Patent: May 22, 2001

(54) ROTATABLE MICROMACHINED DEVICE FOR SENSING MAGNETIC FIELDS

(75) Inventors: Richard S. Payne, Andover; Yang Zhao, North Andover, both of MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/094,012

(22) Filed: Jun. 9, 1998

Related U.S. Application Data

(62) Division of application No. 08/605,743, filed on Feb. 22, 1996, now Pat. No. 5,818,227.

(51) Int. Cl.$^7$ ..................................................... H01F 7/06
(52) U.S. Cl. ........................... 29/602.1; 29/596; 29/598; 29/602.1; 29/607; 29/608
(58) Field of Search ............................... 29/602.1, 607, 29/608, 598, 596

(56) References Cited

U.S. PATENT DOCUMENTS

| | | | | |
|---|---|---|---|---|
| 4,506,221 | * | 3/1985 | Hayner | 324/256 |
| 5,036,286 | | 7/1991 | Holm-Kennedy et al. | 324/661 |
| 5,206,983 | * | 5/1993 | Guckel | 29/598 |
| 5,314,572 | * | 5/1994 | Core | 156/643 |
| 5,326,726 | * | 7/1994 | Tsang | 437/228 |
| 5,345,824 | * | 9/1994 | Sheramn | 73/517 B |
| 5,412,265 | * | 5/1995 | Sickafus | 310/40 MM |
| 5,672,967 | * | 9/1997 | Jensen | 324/253 |
| 5,731,703 | * | 3/1998 | Bernstein | 324/256 |
| 5,946,795 | * | 9/1999 | Altemir | 29/602.1 |

FOREIGN PATENT DOCUMENTS

| | | |
|---|---|---|
| 679341 | 1/1992 | (CH) . |
| 0538899 | 4/1993 | (EP) . |

OTHER PUBLICATIONS

Microtorquemeter for Magnetization Measurements on Small Superconducting Samples, Review of Scientific Instruments, Dec. 1992, No. 12, pp. 5726–5732.

UHV Cantilever Beam Technique for Quantiatative Measurements . . . of Ultrathin Magnetic Films, Physical Review Letters, Aug. 1994, V. 73 No. 8, pp. 1166–1169.

* cited by examiner

*Primary Examiner*—Stephen F. Gerrity
*Assistant Examiner*—Paul D. Kim
(74) *Attorney, Agent, or Firm*—Hale and Dorr LLP

(57) ABSTRACT

A micromachined magnetometer is built from a rotatable micromachined structure on which is deposited a ferromagnetic material magnetized along an axis parallel to the substrate. A structure rotatable about the Z-axis can be used to detect external magnetic fields along the X-axis or the Y-axis, depending on the orientation of the magnetic moment of the ferromagnetic material. A structure rotatable about the X-axis or the Y-axis can be used to detect external magnetic fields along the Z-axis. By combining two or three of these structures, a dual-axis or three-axis magnetometer is obtained.

1 Claim, 5 Drawing Sheets

ROTATABLE MICROMACHINED DEVICE FOR SENSING MAGNETIC FIELDS

CROSS REFERENCE TO RELATED APPLICATION

This application is a divisional of application Ser. No. 08/605,743, filed Feb. 22, 1996, now U.S. Pat. No. 5,818,227.

FIELD OF THE INVENTION

This invention relates to the field of electro-mechanical micromachined structures and, more particularly, to micromachined magnetometers.

BACKGROUND OF THE INVENTION

It is desirable for many purposes to be able to measure accurately a magnetic field. Magnetometers can be used as compasses and are useful in many areas, including virtual reality equipment, electronic games, and automotive products.

Conventional methods to sense magnetic fields include devices that measure the Hall effect, flux change, magnetoresistance, or giant magnetoresistance. While such methods can be effective, there are many areas in which these conventional devices could be improved. For example, it would be advantageous to improve the temperature coefficient and the stability of offsets in such devices, to obtain extremely high sensitivity with high dynamic range, to obtain true tilt sensing instead of total field sensing, to obtain higher linearity, to provide on-chip signal processing with an analog or digital output, to be able to measure magnetic fields in multiple axes with a single device, and to reduce the size of such devices. Also, it would be advantageous to be able to integrate a magnetometer with micromachined inertial sensors, such as accelerometers or yaw rate sensors, on a single chip.

SUMMARY OF THE INVENTION

The present invention is directed to a micromachined structure used as a magnetometer. Applying a magnetic field B to a material with a magnetic moment m causes the material to experience a torque based on the cross-product of the magnetic field and the magnetic moment. In other words, the material experiences a torque $L=m \times B$.

Micromachined silicon structures frequently are used to detect and measure acceleration through the use of differential capacitors. In such sensors, a movable mass is positioned between two plates so that one capacitor is formed by one plate and the mass and a second capacitor is formed by a second plate and the mass. An accelerometer based on this principle and a process for fabricating such an accelerometer are described in commonly assigned U.S. Pat. Nos. 5,345,824, 5,326,726, and 5,314,572, which are incorporated herein by reference.

According to the present invention, a single axis magnetometer is obtained by adding a ferromagnetic material to a micromechanical structure designed to detect rotation. In a preferred embodiment, a single device is used to measure magnetic fields in more than one axis. Devices that are sensitive to magnetic fields in three perpendicular axes can be placed on a single chip, along with accelerometers or other micromachined inertial sensors and resolving circuitry.

In a preferred embodiment, the micromechanical structure utilizes differential capacitors arranged so that rotation of the structure causes the center electrode of each differential capacitor to move closer to one of two fixed electrodes of the differential capacitor and further from the other fixed electrode. The resulting change in differential capacitance is proportional to the amount of movement, which, in turn, is proportional to the angular acceleration (or torque) applied to the structure.

A ferromagnetic material is deposited onto the movable center electrode of the micromechanical structure to give the structure a magnetic moment m. Preferably, the structure has a low moment of inertia, to minimize the sensitivity of the structure to any external mechanical angular vibration that would tend to cause the structure to move. With typical micromachined structures, the moment of inertia of the center electrode will be sufficiently low that in normal applications mechanical vibration will not cause sufficient movement to interfere with the functionality of the magnetometer.

A structure that rotates about an axis perpendicular to the plane of the substrate (ie., that rotates about the Z-axis) is sensitive to a magnetic field along the X-axis if the ferromagnetic material has its magnetic moment aligned with the Y-axis. Similarly, such a structure is sensitive to a magnetic field along the Y-axis if the ferromagnetic material has its magnetic moment aligned with the X-axis.

Structures with perpendicular magnetic moments (e.g., aligned with the X and Y axes) can be obtained through various techniques. In one technique, the ferromagnetic material is applied in long, thin stripes on each of the two structures. The stripes are oriented along the X-axis on the first structure and along the Y-axis on the second structure. A magnetic field is applied to the device at 45 degrees from the X-axis. This causes the magnetic dipoles to be formed along the X-axis for the first structure and along the Y-axis for the second structure.

In a second technique, a hard ferromagnetic material is deposited on one structure and a softer ferromagnetic material is deposited on the other structure. A magnetic field is applied to the device in one direction, magnetizing both ferromagnetic materials. Then, a lower magnetic field is applied in a second direction, orthogonal to the first. The lower magnetic field is sufficient to re-magnetize the softer ferromagnetic material in the second direction, without affecting the magnetization of the harder ferromagnetic material.

A structure that is sensitive to a magnetic field along the Z-axis is formed from a plate suspended above the substrate so that it can rotate in either the X-axis or the Y-axis. A differential capacitor is formed from fixed plates on either side of the suspended plate. A ferromagnetic material is applied to the suspended plate with a magnetic moment oriented about an axis perpendicular to the axis about which the suspended plate can rotate.

Using one of these plate structures and one of the structures that rotates about the taxis permits the design of a dual-axis magnetometer in which the magnetic moments of both structures are oriented along the same axis.

DETAILED DESCRIPTION OF PREFERRED EMBODIMENTS

Figure 1:
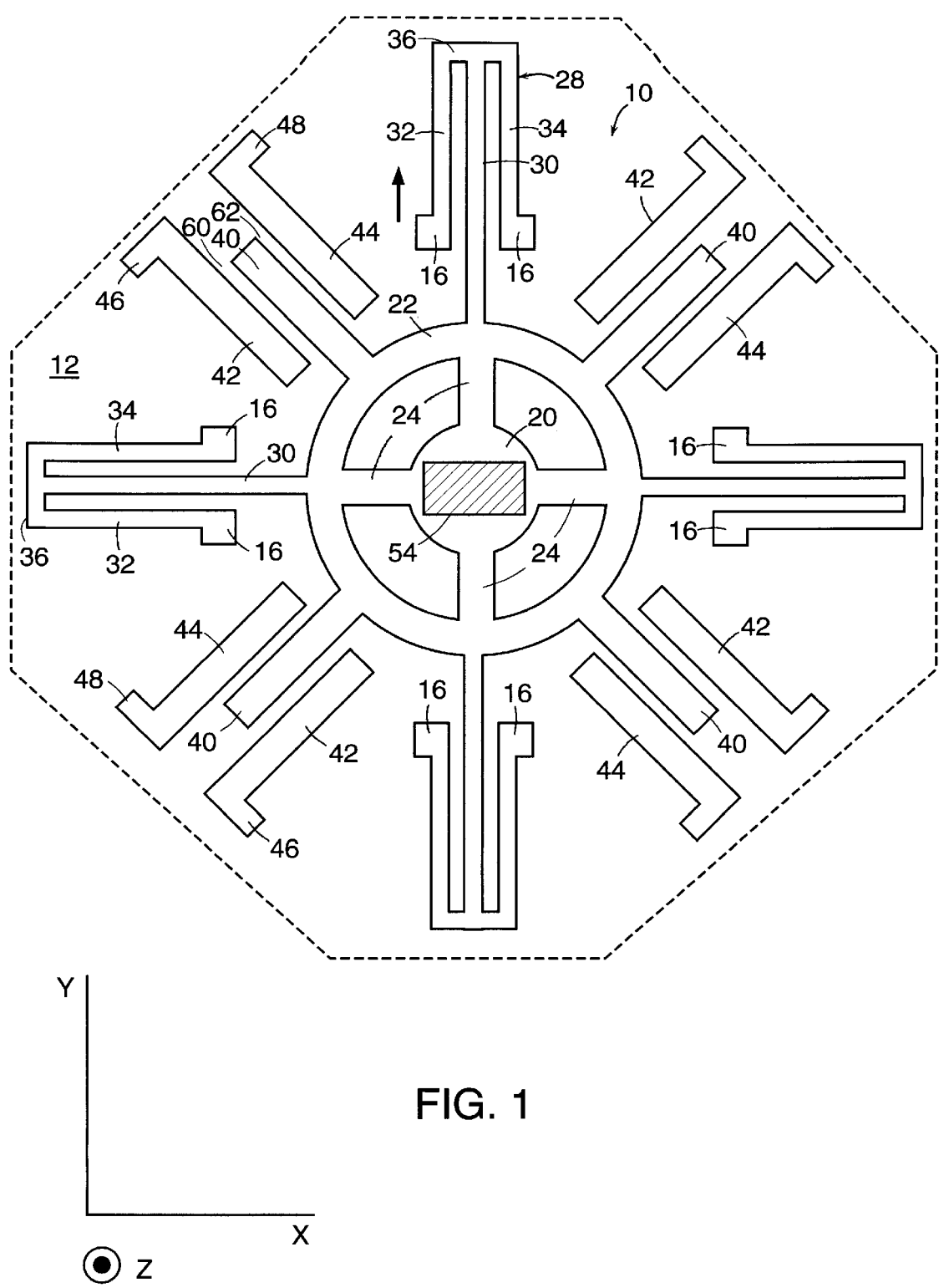
FIG. 1 is a top view of a micromachined magnetometer of an embodiment of the present invention.

A structure for measuring magnetic fields along the X or Y axes is shown in FIG. 1. Magnetometer structure 10 is a 2 micrometer thick polysilicon structure suspended over silicon substrate 12. Magnetometer structure 10 connects to substrate 12 at anchors 16, which are symmetrically positioned around magnetometer structure 10. Anchors 16 also are formed from polysilicon. Disk 20 is at the center of magnetometer structure 10. Beams 24 connect disk 20 to ring 22. The gap between disk 20 and ring 22 helps to reduce the moment of inertia of magnetometer structure 10, minimizing its sensitivity to an external mechanical force that would tend to cause the structure to rotate. Preferably, a mechanical disturbance on the order of 1000 radians/sec$^2$ is required before a detectable rotation will occur.

Suspension arms 28 extend from ring 22, and include long segments 30, 32, and 34, and short segment 36. Long segments 30, 32, and 34 can flex, permitting magnetometer structure 10 to rotate about the Z-axis.

Beam fingers 40 also extend from ring 22. A fixed finger 42 lies parallel to each beam finger 40, in a counterclockwise direction, and a fixed finger 44 lies parallel to each beam finger 40, in a clockwise direction. Anchors 46 and 48 connect fixed fingers 42 and 44, respectively, to substrate 12. Each fixed finger 42 is electrically connected by diffusion segments in substrate 12. Similarly, each fixed finger 44 is electrically connected by diffusion segments in substrate 12. Together, beam fingers 40 and fixed fingers 42 and 44 form a differential capacitor. Only four cells, consisting of a beam finger 40 and fixed fingers 42 and 44, are shown in FIG. 1, for clarity. However, preferably, 20 or more such cells would be used, to obtain greater sensitivity.

Counterclockwise rotation of magnetometer structure 10 brings beam finger 40 closer to fixed finger 42 and further from fixed finger 44. This increases the capacitance of capacitor 60 formed by beam finger 40 and fixed finger 42, and decreases the capacitance of capacitor 62 formed by beam finger 40 and fixed finger 44. Similarly, clockwise rotation of magnetometer structure 10 brings beam finger 40 closer to fixed finger 44 and further from fixed finger 42. This increases the capacitance of capacitor 62 and decreases the capacitance of capacitor 60.

Alternatively, fixed fingers 42 and 44 could be above or below beam finger 40, with the centers of fixed fingers 42 and 44 displaced to either side of the center of beam finger 40. With such an arrangement, rotation of magnetometer structure 10 changes the capacitance of capacitors 60 and 62 by changing the capacitive areas of those capacitors.

Preferably, disk 20 is approximately 100 micrometers in diameter and ring 22 is approximately 200 micrometers in diameter. Long segment 30 of suspension arm 28 is approximately 200 micrometers long and 2 micrometers wide; long segments 32 and 34 are approximately 150 micrometers long and approximately 2 micrometers wide. Beam fingers 40 are approximately 100 micrometers long and fixed fingers 42 and 44 are approximately 100 micrometers long. Each of the fingers 40, 42, and 44 is approximately 3.5 micrometers wide, with a gap of 1.2 micrometers between each beam finger 40 and its adjoining fixed fingers 42 and 44.

Ferromagnetic material 54 is deposited on disk 20 in a rectangular pattern. Preferably, ferromagnetic material 54 is made of barium hexaferride or cobalt platinum chrome. However, nickel or other ferromagnetic materials could be used. Preferably, ferromagnetic material 54 is sputtered onto the top of disk 20 to a thickness on the order of 1000 Angstroms. Alternatively, an electroplating process could be used.

To make magnetometer structure 10 sensitive to magnetic fields oriented along the Y-axis, ferromagnetic material 54 is magnetized to have a magnetic moment oriented along the X-axis (as shown in FIG. 1); alternatively, to make magnetometer structure 10 sensitive to magnetic fields oriented along the X-axis, ferromagnetic material 54 is magnetized to have a magnetic moment oriented along the Y-axis. Preferably, the long sides of ferromagnetic material 54 are oriented parallel to the axis along which ferromagnetic material 54 is magnetized.

Two of these magnetometer structures can be formed on a single chip to obtain a dual-axis magnetometer. For a dual-axis magnetometer using two of these structures, the ferromagnetic material 54 on the first magnetometer structure 10 has a magnetic moment oriented along one axis and the ferromagnetic material 54 on the second magnetometer structure 10 has a magnetic moment oriented along a second axis.

Figure 2:
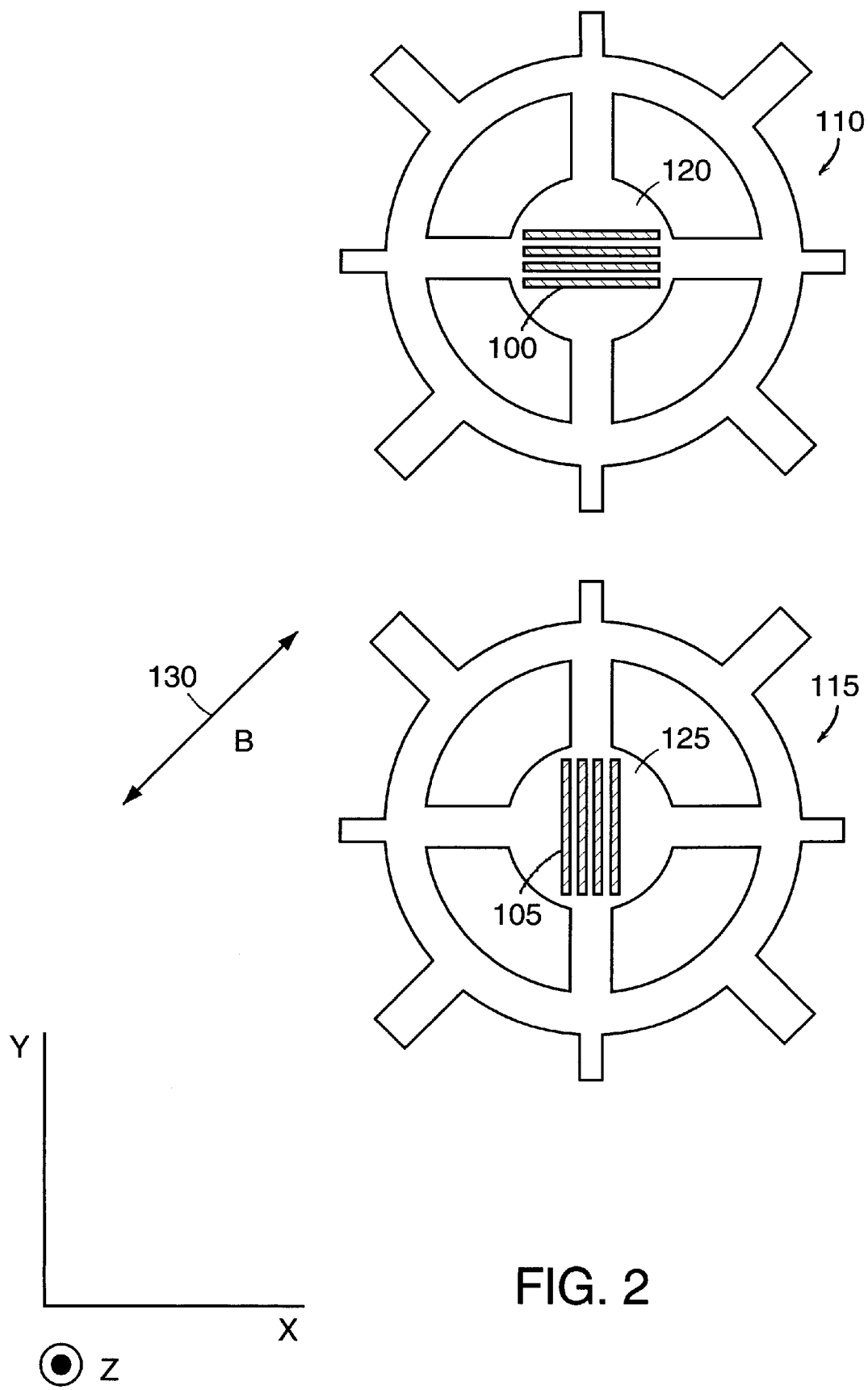
FIG. 2 is a top view of a dual-axis magnetometer of the present invention, illustrating a method for magnetizing two magnetometer structures along two different axes.

As shown in FIG. 2, a dual-axis magnetometer using two of the structures shown in FIG. 1 (only the center portions of the structures are shown in FIG. 2) can be manufactured by depositing a series of stripes of ferromagnetic material 100 on a disk 120 of magnetometer structure 110 along the X-axis and depositing a series of stripes of ferromagnetic material 105 on a disk 125 of magnetometer structure 115 along the Y-axis. An axis of magnetization is established along the length of the stripes (along the X-axis for disk 120 and along the Y-axis for disk 125) by depositing the ferromagnetic material in polycrystalline or amorphous form.

An external magnetic field B is applied to the two magnetometer structures 110 and 115 at an angle approximately 45 degrees from the X-axis, as shown by line 130. This causes a magnetic dipole to be formed along the X-axis in ferromagnetic material 100 on disk 120 and a magnetic dipole to be formed along the Y-axis in ferromagnetic material 105 on disk 125. Magnetometer structure 110 is sensitive to magnetic fields applied along the Y-axis and magnetometer structure 115 is sensitive to magnetic fields applied along the X-axis.

To the extent that processing variations causes the magnetic dipoles to be misaligned from the X-axis and/or the Y-axis, the processing circuitry (described below) can be adjusted by trimming thin film resistors, or through other methods known in the art, to obtain an output that accurately reflects the magnitude along the X-axis and along the Y-axis of magnetic fields.

Figure 3:
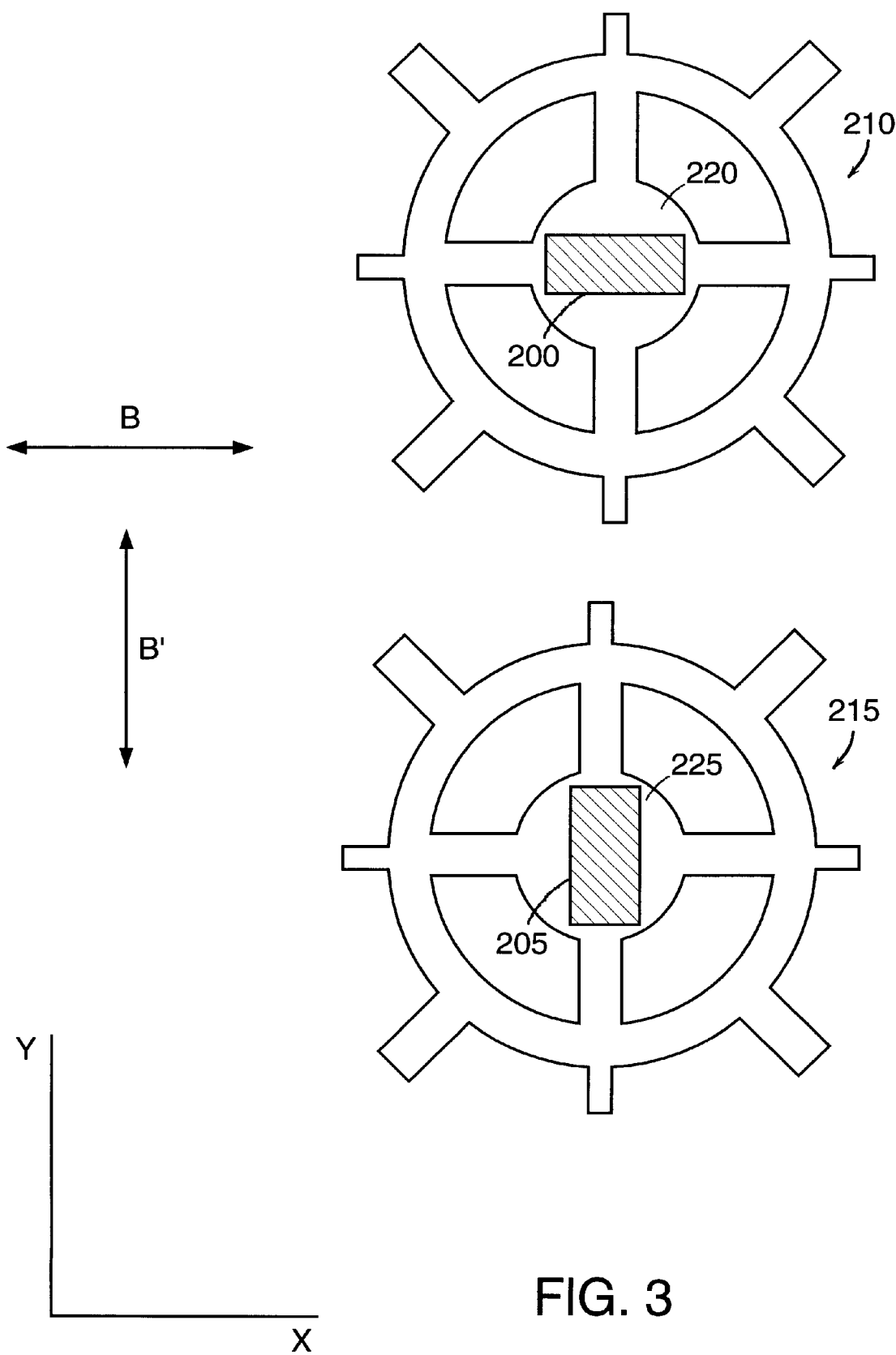
FIG. 3 is a top view of a dual-axis magnetometer of the present invention, illustrating a second method for magnetizing two magnetometer structures along two different axes.

Alternatively, as shown in FIG. 3, a dual-axis magnetometer using two of the structures shown in FIG. 1 can be manufactured by depositing two ferromagnetic materials of different magnetic hardness on the two disks. Ferromagnetic material 200 is deposited on disk 220 of magnetometer structure 210 and ferromagnetic material 205 is deposited on disk 225 of magnetometer structure 215. Ferromagnetic material 200 is harder than, and has a higher coercivity than, ferromagnetic material 205. In addition, ferromagnetic material 200 has a higher Curie temperature than ferromagnetic material 205.

An external magnetic field B is applied to magnetometer structures 210 and 215 along the X-axis. Magnetic field B is greater than the coercive force of ferromagnetic material 200. As a result, ferromagnetic materials 200 and 205 are magnetized (i.e., have a magnetic dipole formed) along the Y-axis.

Magnetic field B is then removed and magnetometer structures 210 and 215 are heated to a temperature greater than the Curie temperature of ferromagnetic material 205 but less than the Curie temperature of ferromagnetic material 200. This removes the magnetic dipole from ferromagnetic material 205.

After cooling magnetometer structures 210 and 215, external magnetic field B' is applied to magnetometer structures 210 and 215 along the Y-axis. External magnetic field B' is greater than the coercive force of ferromagnetic material 205 but less than the coercive force of ferromagnetic material 200. As a result, a magnetic dipole is formed in ferromagnetic material 205 along the Y-axis, while the magnetic dipole in ferromagnetic material 200 remains along the X-axis. Alternatively, this method can be utilized without heating magnetometer structures 210 and 215, by using external magnetic fields to demagnetize and then re-magnetize ferromagnetic material 205 without affecting ferromagnetic material 200.

Figure 4:
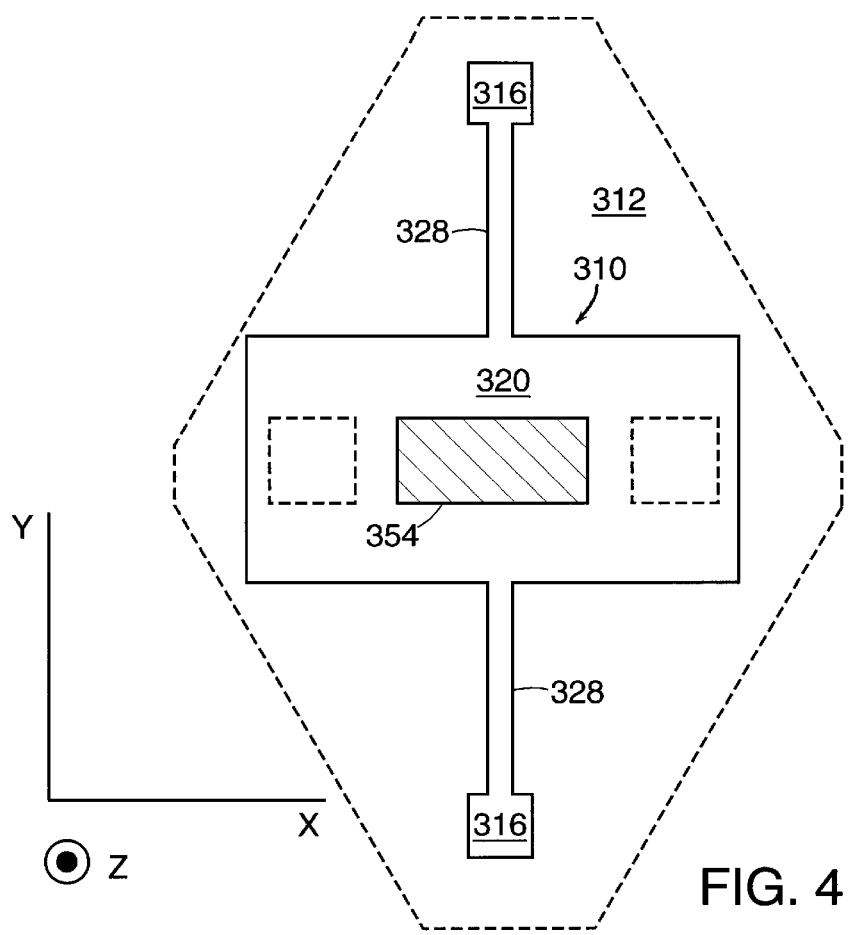
FIG. 4 is a top view of a micromachined magnetometer of a second embodiment of the present invention.

A structure for measuring magnetic fields along the taxis is shown in FIG. 4. Polysilicon magnetometer structure 310 is approximately 2 micrometers thick and includes plate 320 suspended above substrate 312. Preferably, the long sides of plate 320 are approximately 250 micrometers long and the short sides of plate 320 are approximately 150 micrometers long. The long sides extend along the X-axis and the short sides extend along the Y-axis. Magnetometer structure 310 connects to substrate 312 at anchors 316, on opposite sides of magnetometer structure 310. Anchors 316 also are formed from polysilicon. Suspension arms 328 extend from the middle of the long sides of plate 320, along the Y-axis, to anchors 316. Suspension arms 328 are each approximately 40 micrometers long and approximately 2 micrometers wide, and are able to twist about the Y-axis, causing plate 320 to rotate clockwise or counterclockwise about the Y-axis.

Figure 5:
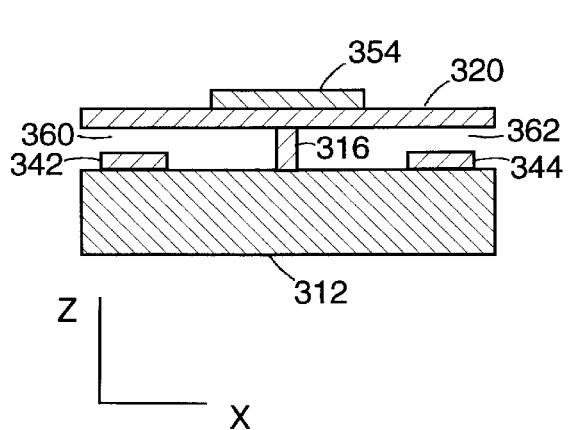
FIG. 5 is a side view of the micromachined magnetometer depicted in FIG. 4.

As shown in FIGS. 4 and 5, fixed plate 342 is positioned below one side of plate 320 and fixed plate 344 is positioned below the other side of plate 320. Fixed plates 342 and 344 are approximately 0.5 micrometers thick and are formed from polysilicon deposited over substrate 312.

Together, plate 320, fixed plate 342, and fixed plate 344 form a differential capacitor. Counterclockwise rotation of magnetometer structure 310 brings plate 320 closer to fixed plate 342 and further from fixed plate 344. This increases the capacitance of capacitor 360 formed by plate 320 and fixed plate 342 and decreases the capacitance of capacitor 362 formed by plate 320 and fixed plate 344. Similarly, clockwise rotation of magnetometer structure 310 brings plate 320 closer to fixed plate 344 and further from fixed plate 342. This increases the capacitance of capacitor 362 and decreases the capacitance of capacitor 360.

Ferromagnetic material 354 is deposited on plate 320 and magnetized to have a magnetic moment oriented along the X-axis. Alternatively, magnetometer structure 310 can be oriented with its long sides and the magnetic moment of ferromagnetic material 354 along the Y-axis.

Figure 6:
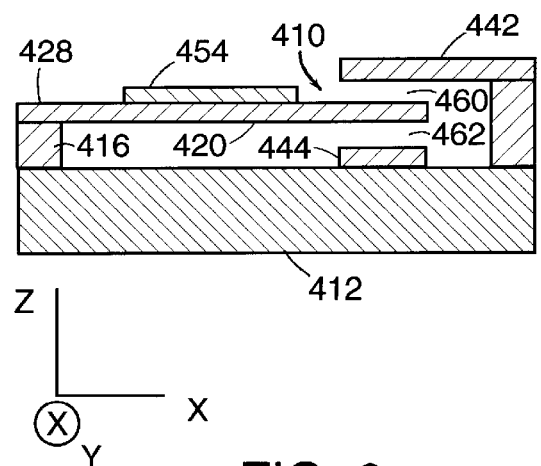
FIG. 6 is a side view of a micromachined magnetometer of a third embodiment of the present invention.

A structure for measuring magnetic fields along the Z-axis also can be based on a cantilevered structure, with fixed plates above and below the free end of the cantilever. As shown in FIG. 6, magnetometer structure 410 includes polysilicon plate 420 suspended above substrate 412 by suspension arms 428 connected to anchors 416. Magnetometer structure 410 is similar to magnetometer structure 310 of FIGS. 4 and 5, but with the portion of plate 320 to the left side of suspension arms 328 omitted and with the fixed plates and ferromagnetic material moved.

Magnetometer structure 410 can rotate about the Y-axis. Fixed plate 442, formed from an additional polysilicon layer, extends above the free end of plate 420. Fixed plate 444, formed from polysilicon deposited over substrate 412, is positioned below the free end of plate 420.

Together, plate 420, fixed plate 442, and fixed plate 444 form a differential capacitor. Counterclockwise rotation of magnetometer structure 410 brings plate 420 closer to fixed plate 442 and further from fixed plate 444. This increases the capacitance of capacitor 460 formed by plate 420 and fixed plate 442 and decreases the capacitance of capacitor 462 formed by plate 420 and fixed plate 444. Similarly, clockwise rotation of magnetometer structure 410 brings plate 420 closer to fixed plate 444 and further from fixed plate 442. This increases the capacitance of capacitor 462 and decreases the capacitance of capacitor 460.

Ferromagnetic material 454 is deposited on plate 420 and magnetized to have a magnetic moment oriented along the X-axis. Alternatively, magnetometer structure 410 can be oriented with its long sides and the magnetic moment of ferromagnetic material 454 along the Y-axis.

The rotatable structures described above can be manufactured with surface micromachining techniques known in the art. A surface micromachining method is shown, for example, in U.S. Pat. No. 5,314,572.

A magnetometer structure for sensing magnetic fields along the Z-axis can be formed on the same chip as a magnetometer structure for sensing magnetic fields along the X-axis or the Y-axis to obtain a dual-axis magnetometer. Preferably, when using two of these magnetometer structures, the magnetic moments of each are along the same axis to simplify the magnetization of the structures.

A three-axis magnetometer can be formed from a magnetometer structure sensitive to magnetic fields along the X-axis, a magnetometer structure sensitive to magnetic fields along the Y-axis, and a magnetometer structure sensitive to magnetic fields along the Z-axis on the same chip. The methods described above for magnetizing a dual-axis magnetometer also can be used for a three-axis magnetometer. For example, the ferromagnetic material can be applied to each magnetometer structure in stripes. The stripes on the sensor for measuring magnetic fields along the Z-axis are aligned with the long sides of the rotatable plate. Or, one ferromagnetic material can be deposited on the Z-axis sensor and one of the other sensors, with a second ferromagnetic material deposited on the third sensor.

In normal operation, when an external magnetic field B is applied to the magnetometer, a torque L is produced based on the cross-product of the magnetic field B and the magnetic moment m of the ferromagnetic material deposited on the rotatable structure:

$$L = m \times B$$

The magnitude of this torque depends on the orientation of the magnetic dipole relative to the direction of the external magnetic field:

$$|L| = |m \times B| = m \cdot B \cdot \sin \alpha$$

where $\alpha$ is the orientation angle of the magnetic dipole relative to the direction of the external magnetic field B. This torque tends to rotate the structure but is opposed by the restoring torque produced by the suspension of the structure. The restoring torque is based on the angular displacement $\theta$ of the structure according to the equation:

$$L = K \cdot \theta$$

where K is the rotational spring constant of the structure.

In equilibrium, the torques are equal:

$$L = K \cdot \theta = m \cdot B \cdot \sin \alpha$$

Solving for θ yields:

$$\theta = (m \cdot B \cdot \sin \alpha)/K$$

Thus, given a fixed magnetic moment m and rotational spring constant K, the angular displacement of the structure is linearly proportional to the external magnetic field B and to sin α. Also, given a magnetic moment aligned along one axis, the angular displacement is linearly proportional to the strength of the external magnetic field along an axis perpendicular to the axis of the magnetic moment. Hence, by determining the angular displacement of the structure, the strength of a magnetic field along a given axis can be determined.

In a preferred embodiment, the ferromagnetic material is magnetized so that its magnetic moment m is on the order of $10^{-6}$ emu, and the rotational spring constant K of the structure is approximately between 0.01 and 1.0 dyne-cm. A typical magnetometer according to the present invention may be capable of resolving angular displacements on the order of $10^{-10}$ radians, and magnetic fields on the order of 1 milliGauss or better.

Figure 7:
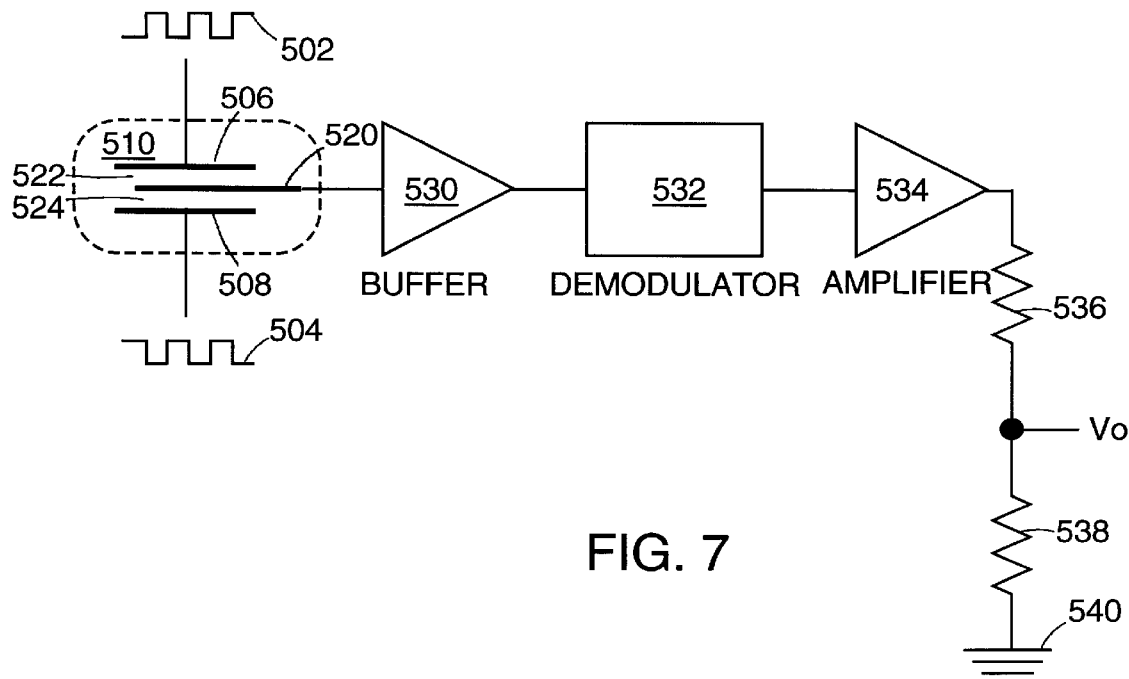
FIG. 7 is a partial block, partial schematic diagram of a circuit for use with a magnetometer according to the present invention.

The differential capacitor of any of the structures described above is used to sense the angular displacement θ. As shown in FIG. 7, illustrating an open-loop circuit configuration, two carrier signals 502 and 504 are applied to fixed electrodes 506 and 508 of differential capacitor 510. Fixed electrodes 506 and 508 correspond, for example, to fixed fingers 42 and 44 shown in FIG. 1, to fixed plates 342 and 344 shown in FIG. 4, and to fixed plates 442 and 444 shown in FIG. 6. Carrier signals 502 and 504 are at the same frequency and 180 degrees out of phase with each other. Typically, carrier signals 502 and 504 are between approximately 100 KHz and 1 MHz. Different D.C. offsets may also be applied to fixed electrodes 506 and 508.

When the rotatable structure is in its rest position, not exposed to an external magnetic field, center electrode 520, which is part of the rotatable structure, is centered between fixed electrodes 506 and 508. The capacitance of capacitor 522 formed by center electrode 520 and fixed electrode 506 is equal to the capacitance of capacitor 524 formed by center electrode 520 and fixed electrode 508. Center electrode 520 corresponds, for example, to beam finger 40 shown in FIG. 1, or to plate 320 shown in FIG. 4, or to plate 420 shown in FIG. 6. With the capacitances of capacitors 522 and 524 equal, no signal is induced on center electrode 520 by carrier signals 502 and 504.

When the rotatable structure and center electrode 520 are rotated due to the external torque produced by an external magnetic field, the capacitances of capacitors 522 and 524 change in opposite directions. For example, if center electrode 520 rotates to be closer to fixed electrode 506 (and further from fixed electrode 508), the capacitance of capacitor 522 increases and the capacitance of capacitor 524 decreases. This differential change induces a signal at the frequency of carrier signals 502 and 504 on center electrode 520. The amplitude of the induced signal is proportional to the rotation of center electrode 520 and of the rotatable structure.

The differential signal is applied to the input of buffer 530. The output of buffer 530 is applied to the input of demodulator 532, to obtain a base band displacement signal. The output of demodulator 532 is applied to amplifier 534, the output of which is -proportional to the angular displacement and the magnitude of the external magnetic field along a sensitive axis. The sensitive axis is the axis perpendicular to both the axis of rotation and the axis along which the ferromagnetic material is magnetized.

Thin film resistors 536 and 538 are connected in series between the output of amplifier 534 and ground 540. The output signal, Vo, is obtained from the node between resistors 536 and 538. By trimming one or both resisters 536 and 538 signal Vo, the device can be adjusted for processing variations or otherwise calibrated.

Figure 8:
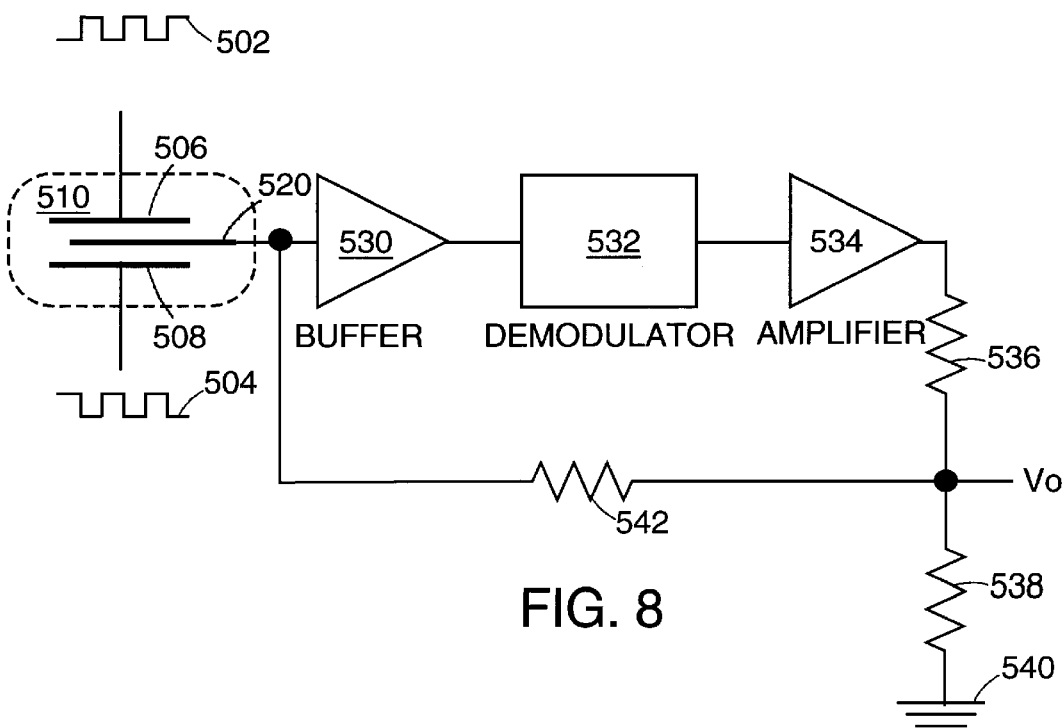
FIG. 8 is a partial block, partial schematic diagram of a second circuit for use with a magnetometer according to the present invention.

Alternatively, a closed-loop configuration can be used. For example, as shown in FIG. 8, the output signal 16 can be fed back to center electrode 520 through resistor 542. Resistor 542 is typically 3 megohms. Preferably, with a closed-loop configuration, different D.C. offsets are applied to fixed electrodes 506 and 508. Preferably, the circuit components, including buffer 530, demodulator 532, amplifier 534, and resistors 536, 538, and 542, are ali formed in the substrate through conventional integrated circuit fabrication techniques.

Circuits for an open-loop and a closed-loop configuration are further described in U.S. Pat. No. 5,345,824.

In a typical embodiment, a separate circuit is used for each rotatable structure (that is, for each axis of sensitivity).

While there have been shown and described examples of the present invention, it will be readily apparent to those skilled in the art that various changes and modifications may be made therein without departing from the scope of the invention as defined by the appended claims. Accordingly, the invention is limited only by the following claims and equivalents thereto.

What is claimed is:

1. A method for fabricating a micro-machined electromechanical device comprising the steps of:

depositing a first plurality of stripes of a ferromagnetic material onto a first sensor structure, wherein each of the first plurality of stripes is oriented approximately along a first axis;

depositing a second plurality of stripes of a ferromagnetic material onto a second sensor structure, wherein each of the second plurality of stripes is oriented approximately along a second axis, approximately perpendicular to the first axis; and applying a magnetic field to the device, wherein the magnetic field is oriented along a first direction within a plane formed by the first axis and the second axis, the first direction being at an angle approximately 45 degrees from the first axis, and wherein application of the magnetic field causes a magnetic dipole to be formed in the first plurality of stripes along the first axis and causes a magnetic dipole to be formed in the second plurality of stripes along the second axis.

* * * * *